US010061212B2

(12) United States Patent
Van Der Schaar et al.

(10) Patent No.: US 10,061,212 B2
(45) Date of Patent: Aug. 28, 2018

(54) METROLOGY TARGET, METHOD AND APPARATUS, TARGET DESIGN METHOD, COMPUTER PROGRAM AND LITHOGRAPHIC SYSTEM

(71) Applicant: ASML Netherlands B.V., Veldhoven (NL)

(72) Inventors: Maurits Van Der Schaar, Eindhoven (NL); Richard Johannes Franciscus Van Haren, Waarle (NL); Everhardus Cornelis Mos, Best (NL); Youping Zhang, Dublin, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/477,602

(22) Filed: Apr. 3, 2017

(65) Prior Publication Data

US 2017/0293233 A1 Oct. 12, 2017

Related U.S. Application Data

(60) Provisional application No. 62/320,780, filed on Apr. 11, 2016.

(51) Int. Cl.
*G03F 7/20* (2006.01)
*H01L 21/66* (2006.01)
*H01L 23/544* (2006.01)

(52) U.S. Cl.
CPC ...... *G03F 7/70633* (2013.01); *G03F 7/70516* (2013.01); *G03F 7/70616* (2013.01);
(Continued)

(58) Field of Classification Search
CPC ............ G03F 7/70633; G03F 7/70683; G03F 7/70516; G03F 7/70616; H01L 22/00; H01L 22/12; H01L 23/544; G01B 11/14
(Continued)

(56) References Cited

U.S. PATENT DOCUMENTS

2003/0160163 A1 8/2003 Wong et al.
2005/0018190 A1 1/2005 Sezginer et al.
(Continued)

FOREIGN PATENT DOCUMENTS

EP 1 400 855 A2 3/2004
WO WO 2009/078708 A1 6/2009
(Continued)

OTHER PUBLICATIONS

International Search Report and Written Opinion of the International Searching authority directed to related International Patent Application No. PCT/EP2017/057221, dated Jul. 10, 2017; 13 pages.

*Primary Examiner* — Gordon J Stock, Jr.
(74) *Attorney, Agent, or Firm* — Sterne, Kessler, Goldstein & Fox P.L.L.C.

(57) ABSTRACT

Disclosed is a method of measuring a target, associated substrate comprising a target and computer program. The target comprises overlapping first and second periodic structures. The method comprising illuminating the target with measurement radiation and detecting the resultant scattered radiation. The pitch of the second periodic structure is such, relative to a wavelength of the measurement radiation and its angle of incidence on the target, that there is no propagative non-zeroth diffraction at the second periodic structure resultant from said measurement radiation being initially incident on said second periodic structure. There may be propagative non-zeroth diffraction at the second periodic structure which comprises further diffraction of one or more non-zero diffraction orders resultant from diffraction by the first periodic structure. Alternatively, the detected scattered radiation may comprise non-zero diffraction orders obtained from diffraction at said the periodic structure which have been disturbed in the near field by the second periodic structure.

15 Claims, 6 Drawing Sheets

(52) U.S. Cl.
CPC .......... *G03F 7/70683* (2013.01); *H01L 22/00* (2013.01); *H01L 22/12* (2013.01); *H01L 23/544* (2013.01)

(58) Field of Classification Search
USPC ..... 356/399–401; 355/53, 55, 77; 430/5, 22, 430/30; 438/401; 257/797; 382/151
See application file for complete search history.

(56) References Cited

U.S. PATENT DOCUMENTS

| | | |
|---|---|---|
| 2007/0229829 A1 | 10/2007 | Kandel et al. |
| 2008/0014299 A1 | 1/2008 | Amano et al. |
| 2010/0265506 A1* | 10/2010 | Den Boef ........... G03F 7/70633 356/399 |
| 2010/0328655 A1* | 12/2010 | Den Boef ........... G03F 7/70633 356/237.5 |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2015/0233705 A1 | 8/2015 | Bringoltz et al. |

FOREIGN PATENT DOCUMENTS

| | | |
|---|---|---|
| WO | WO 2009/106279 A1 | 9/2009 |
| WO | WO 2010/007010 A1 | 1/2010 |
| WO | WO 2011/012624 A1 | 2/2011 |

\* cited by examiner

METROLOGY TARGET, METHOD AND APPARATUS, TARGET DESIGN METHOD, COMPUTER PROGRAM AND LITHOGRAPHIC SYSTEM

CROSS REFERENCE TO RELATED APPLICATIONS

This application claims benefit to and incorporates by reference in its entirety U.S. Patent Application No. 62/320,780, filed Apr. 11, 2016.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the −1st and the +1st diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay error (undesired misalignment of two layers).

When measuring thick stacks, where there may be a significant distance between the two layers being measured, the difference in path lengths between radiation diffracted by a lower grating of a target and radiation diffracted by an upper grating of a target may result in measurement instability due to oscillations. It would be desirable to minimize this path length difference. Additionally, or alternatively, it may be desirable to measure targets where one of the constituent gratings has a pitch smaller than is required to generate propagating non-zero diffraction orders.

SUMMARY

A first aspect provides a method of measuring a target, said target comprising overlapping periodic structures, said overlapping periodic structures comprising a first periodic structure and a second periodic structure; said method comprising illuminating the target with measurement radiation and detecting the resultant scattered radiation; wherein a pitch of said second periodic structure is such, relative to a wavelength of the measurement radiation and its angle of incidence on the target, that there is no propagative non-zeroth diffraction at said second periodic structure resultant from said measurement radiation being initially incident on said second periodic structure.

A second aspect provides a substrate comprising an overlay target for measurement of overlay, said overlay target comprising overlapping periodic structures, said overlapping periodic structures comprising a first periodic structure and a second periodic structure; wherein the second periodic structure comprises a pitch smaller than the first periodic structure.

A third aspect provides an overlay target for measurement of overlay, said overlay target comprising overlapping periodic structures, said overlapping periodic structures comprising a first periodic structure and a second periodic structure; wherein a pitch of said second periodic structure is such, relative to a wavelength of the measurement radiation and its angle of incidence on the target, that there is no propagative non-zeroth diffraction in reflection at said second periodic structure resultant from said measurement radiation being initially incident on said second periodic structure.

A fourth aspect provides a target design method for designing the overlay target of the third aspect.

A fifth aspect computer program comprising processor readable instructions which, when run on suitable processor controlled apparatus, cause the processor controlled apparatus to perform the method of the first aspect or fourth aspect, and a computer program carrier comprising such a computer program.

Further features and advantages, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
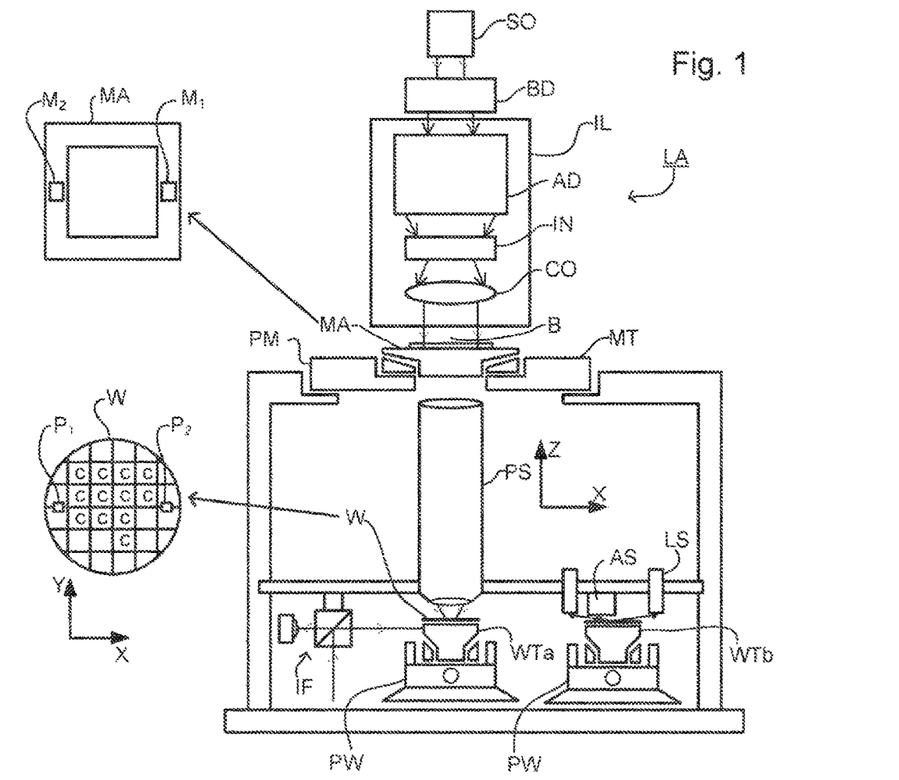
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
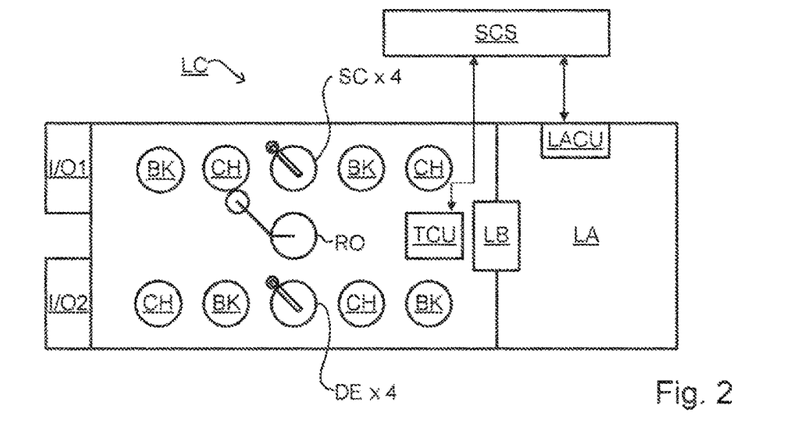
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figures 3A, 3B, 3C, 3D:
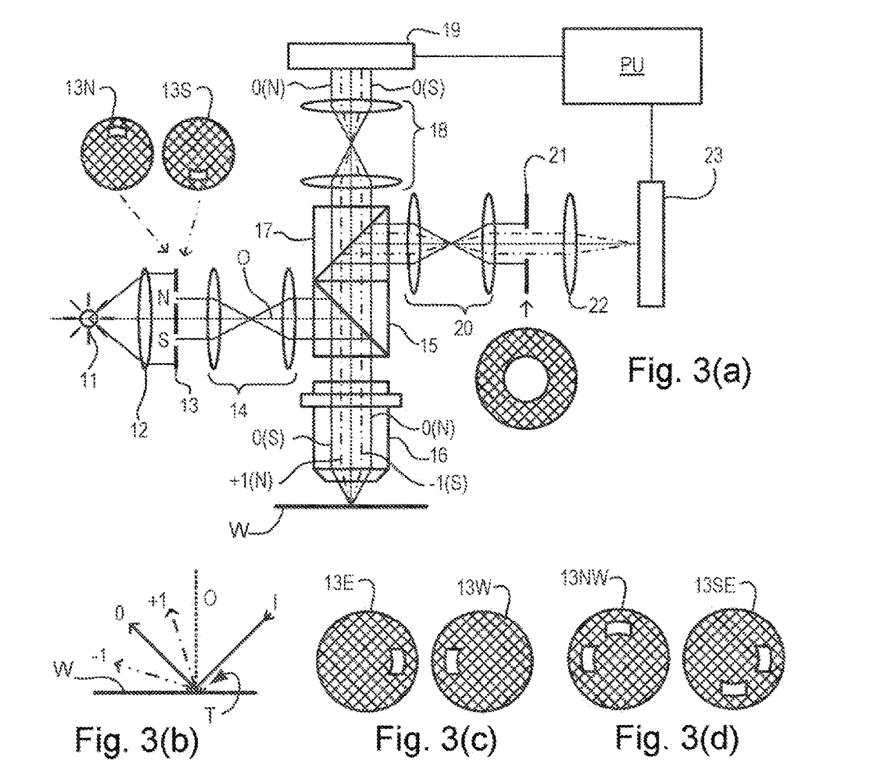
FIGS. 3(a)-(d) comprise (a) a schematic diagram of a dark field scatterometer for use in measuring targets using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates (e.g., 13E, 13W, 13NW, and 13SE) are shown in FIGS. 3 (c) and (d). The use of these, and numerous other variations and applications of the apparatus are described in prior published applications, mentioned above.

Figure 4:
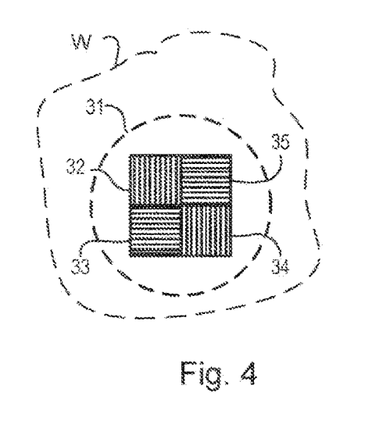
FIG. 4 depicts a known form of multiple grating target and an outline of a measurement spot on a substrate.

FIG. 4 depicts an overlay target or composite overlay target formed on a substrate according to known practice. The overlay target in this example comprises four sub-overlay targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensors 19 and 23. In an example dedicated to measurement of overlay, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of an overlay target. An overlay target may comprise more or fewer than 4 gratings, or only a single grating.

Figure 5:
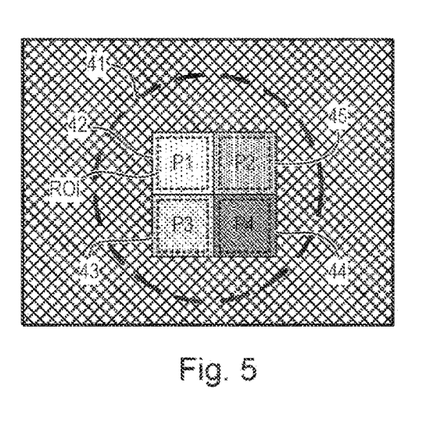
FIG. 5 depicts an image of the target of FIG. 4 obtained in the scatterometer of FIG. 3.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small overlay target gratings 32 to 35. If the overlay targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
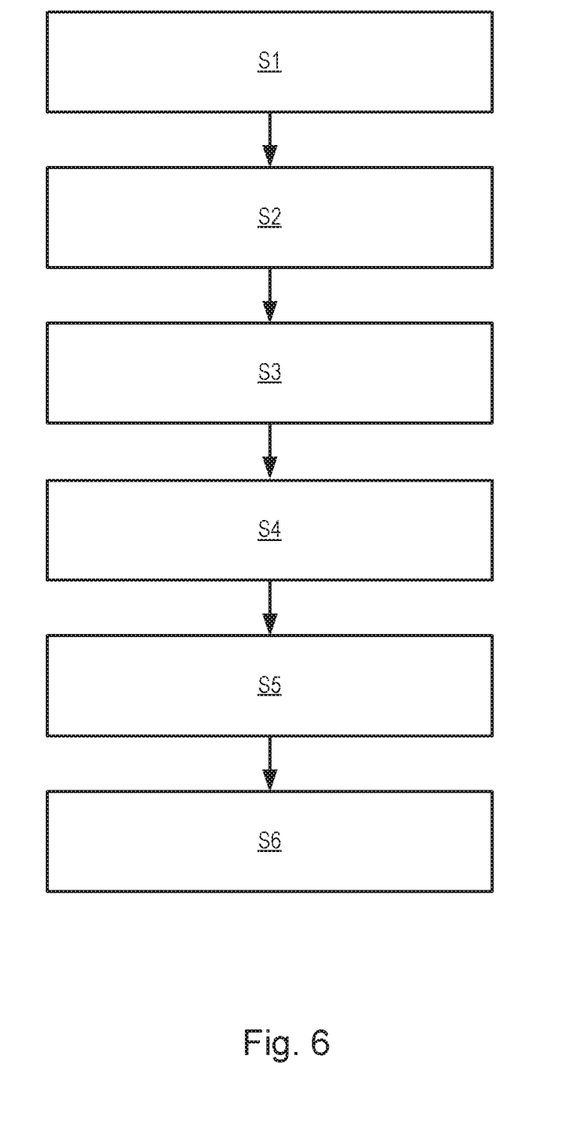
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error (i.e., undesired and unintentional overlay misalignment) between the two layers containing the component overlay targets 32 to 35 is measured. Such a method may be referred to a micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create an overlay target including the gratings 32-35. At S2, using the metrology apparatus of FIG. 3 or FIG. 9, an image of the overlay targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the overlay targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level. In step S4, a region of interest (ROI), for example, corresponding to any of regions P1-P4 illustrated in FIG. 5, is identified within the image of each component overlay target, from which intensity levels will be measured.

Having identified the ROI for each individual overlay target and measured its intensity, the asymmetry of the overlay target, and hence overlay error, can then be determined. This is done (e.g., by the processor PU) in step S5 comparing the intensity values obtained for +1 and −1 orders for each overlay target 32-35 to identify their intensity asymmetry, e.g., any difference in their intensity. The term "difference" is not intended to refer only to subtraction. Differences may be calculated in ratio form. In step S6 the measured intensity asymmetries for a number of overlay targets are used, together with knowledge of any known imposed overlay biases of those overlay targets, to calculate one or more performance parameters of the lithographic process in the vicinity of the overlay target T. In the applications described herein, measurements using two or more different measurement recipes will be included. A performance parameter of great interest is overlay.

Figure 7:
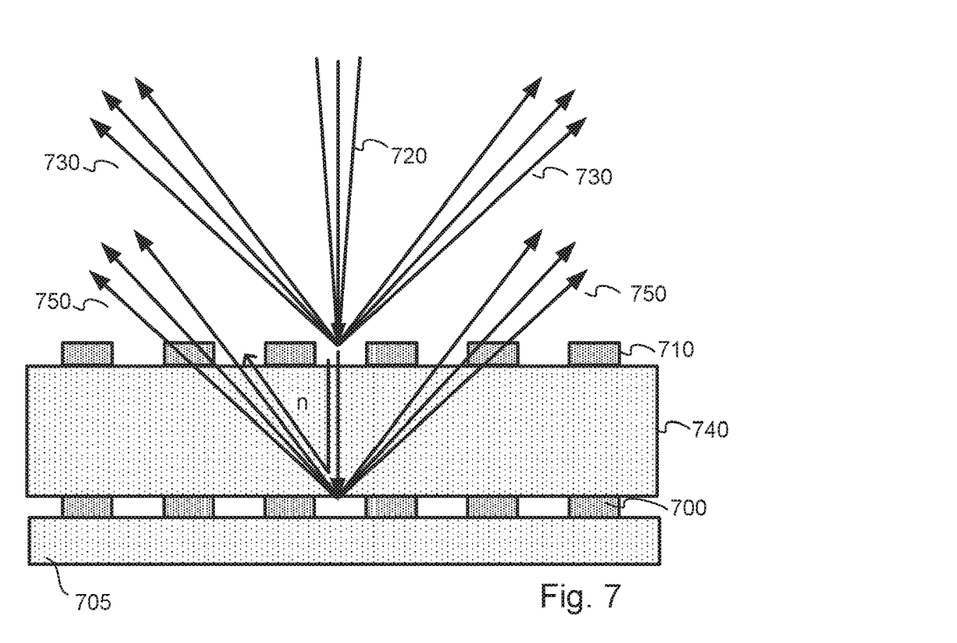
FIG. 7 illustrates some of the main diffraction modes resultant from diffraction by an overlay target in a known manner.

FIG. 7 illustrates a typical diffraction configuration of an overlay target comprising overlapping periodic structures. The overlapping periodic structures comprise a first periodic structure (or first grating) and a second periodic structure (or second grating). In the specific example shown, there is a first (lower) grating 700 in a first layer and a second (upper) grating 710 in a second layer, all formed on a substrate 705. Between the first grating 700 and second grating 710 is layer material 740, which (in this schematic example) may include the material that the second layer structures will be etched into. Measurement radiation 720 is incident on the second grating 710, resulting in diffraction forming non-zero (e.g., first) diffraction orders 730. In addition, some of the measurement radiation 720 (the zeroth order) passes through second grating 710 and layer material 740 to be incident on the first grating 700, where again there is diffraction forming non-zero (e.g., first) diffraction orders 750. The non-zero diffraction orders 730 from the second grating 710 and non-zero diffraction orders 750 from the first grating 700 eventually interfere (e.g., in the far field) to form an overlay signal which can be captured by a sensor (e.g., sensor 19 or sensor 23 of the apparatus depicted in FIG. 3(a)). Note that this diagram is provided only to illustrate the relevant principle of generating an overlay signal and, for simplicity, does not show all the diffraction modes (e.g., the transmissive diffraction modes are not shown). As has already been described, there may be a deliberate offset (not shown) between the first grating 700 and second grating 710.

Measurement of overlay targets using diffractive metrology methods such as those described above is more accurate for thinner stacks, where the distance (in the z-direction perpendicular to the substrate plane) between the two layers being measured is not too large. Measurement of thicker stacks presents greater difficulty. This is because, for thicker stacks, there can be a significant path length difference (relative to the wavelength of the measurement radiation used) between measurement radiation diffracted from a first (lower) grating and radiation diffracted from a second (upper) grating. This is shown as additional distance n on FIG. 7. Additionally, a change in the stack (e.g. a thickness change in one of the layers) further contributes to this difficulty. Such a path length difference may result in numerous zero crossings (oscillations) in the asymmetry signal in the pupil plane. This makes the resultant asymmetry measurement unstable and very highly dependent on the measurement radiation wavelength.

To address this issue, a new target design is proposed. The target is designed to minimize any path length difference (within the stack) between radiation diffracted from the first (lower) grating and radiation diffracted from the second (upper) grating. To achieve this, the target is designed such that any diffraction in reflection at the second (upper) grating will comprise only evanescent orders which therefore will not be detected. Diffraction at the second (upper) grating will instead be indirect diffraction, i.e., diffraction in transmission of the radiation diffracted from the first (lower) grating. In this way, diffraction at the second grating in reflection is avoided, but there is still diffraction in transmission at the second grating (due to the change in refractive index) of reflective diffraction orders from the first grating. More specifically, this indirect diffraction may comprise diffraction of non-zero (e.g., first) diffraction orders which were resultant from diffraction in reflection at the first grating, the indirect diffraction forming further non-zero (e.g., first) diffraction orders resultant from diffraction in transmission at the second grating. This effect can be obtained by modifying the second grating such that it has a pitch which is smaller than or equal to the wavelength of the measurement radiation used.

Figure 8:
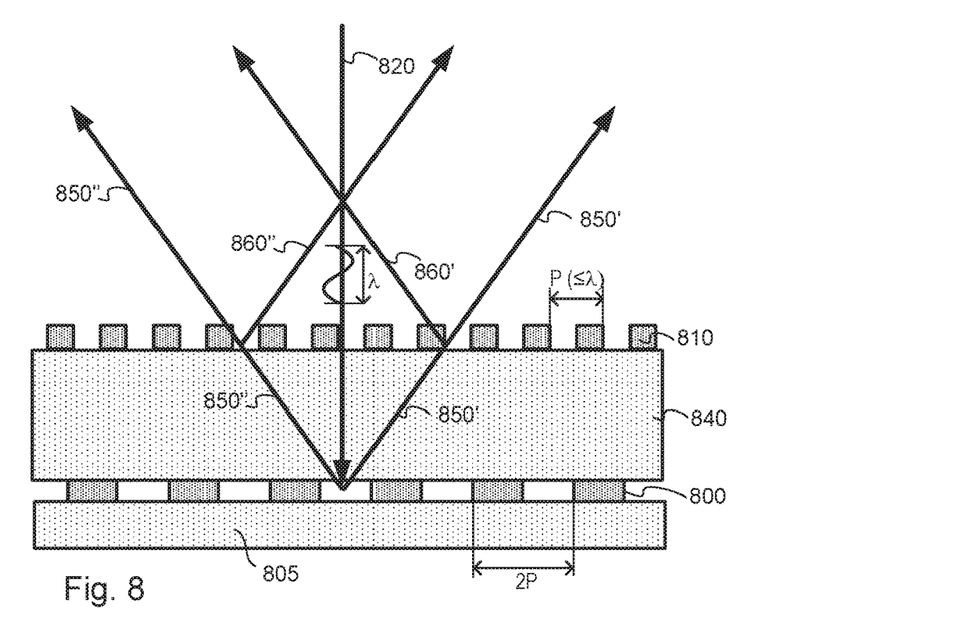
FIG. 8 illustrates diffraction by an overlay target according to an overlay measurement method of a first embodiment of the invention.
Figure 9A:
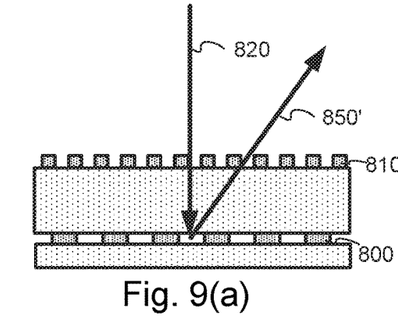
FIGS. 9(a)-(e) illustrate separately 5 main diffraction modes of the diffraction illustrated in FIG. 8.
Figure 9B:
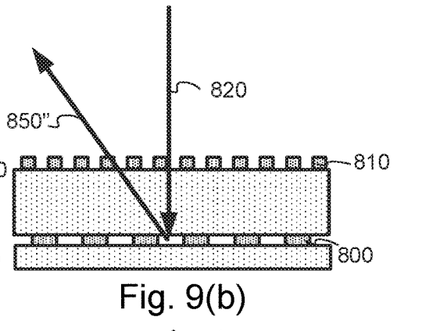
Figure 9C:
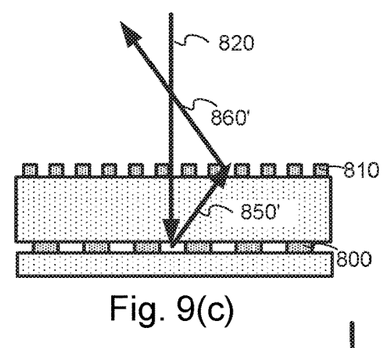
Figure 9D:
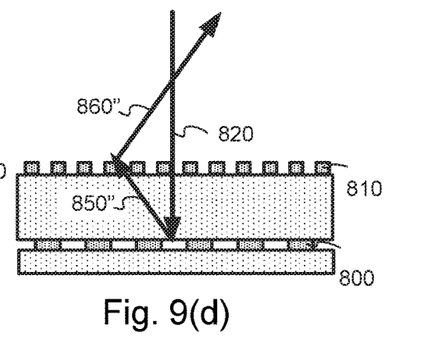
Figure 9E:
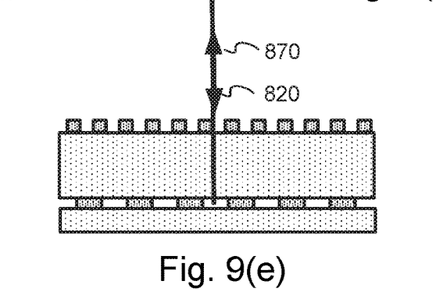

FIG. 8 illustrates such a target design, where like features are provided with equivalent reference numerals (e.g., substrate 705 and substrate 805, and layer material 740 and layer material 840). FIG. 8 shows measurement radiation 820 having wavelength λ which is (e.g., normally) incident on a second (upper) grating 810. Second grating 810 has a pitch P which is equal to or smaller than the wavelength λ of the measurement radiation 820. The zeroth order of the measurement radiation 820 will pass through the second grating 810, while any other diffraction orders will comprise only evanescent diffraction orders which quickly dissipate and therefore will not be detected. A first (lower) grating 800 has a pitch larger than wavelength λ of measurement radiation 820. Therefore the (zeroth order) measurement radiation 820 which passes through the second grating 810, will be diffracted by the first grating 800 resulting in (non-evanescent or propagative) higher diffraction orders (reflective). In the example shown, only the +1 order 850' and −1 order 850" are shown. Each of these diffraction orders 850', 850" is then incident on the second grating 810 (from below), where there will be secondary diffraction (transmissive). As a result of the secondary diffraction, a higher (e.g., 1st order) diffraction order 860' 860" will be diffracted from the second grating 810 for each of the diffraction orders 850', 850" obtained from the diffraction at the first grating 800. In addition the first diffraction orders 850', 850" will pass through the second grating 810 as zeroth order radiation. The radiation diffracted from the second grating 860', 860" and the radiation diffracted from the first grating 850', 850" will then interfere to provide an overlay signal.

While the pitch P of the top grating should be smaller than or equal to wavelength λ it should be appreciated that it should not be too small or there may not be propagative secondary diffraction at the second grating 810 resulting in diffraction orders 860' 860". As such it should be appreciated that the pitch P of the second grating 810 (and the pitch of first grating 800) should be selected, for a given measurement radiation wavelength λ (and for a given aperture shape), to ensure no propagative non-zero diffraction orders are generated when the measurement radiation is first incident on the second grating 810, but that propagative non-zero diffraction orders are generated when the diffraction orders 850', 850", generated by diffraction at the first grating 800, are incident on the second grating 810. This is a relatively simple matter to determine mathematically and/or experimentally, as the skilled person will appreciate. Alternatively, a metrology target design platform, such as D4C (described in more detail later), can be used in making this determination. Note that, for simplicity, primary transmissive diffraction through the second grating 810 (in the direction toward the first grating 800) is not shown—it is of course possible to eliminate these diffraction orders also by reducing the pitch P below λ/n, but this is not always necessary.

The first grating 800 preferably has a pitch which is an integer multiple of the pitch of the second grating 810, to eliminate Moiré effects. In an embodiment, the pitch of the first grating 800 is twice the pitch P of the second grating 810.

FIG. 9 shows the individual modes which contribute to the overlay signal. FIG. 9(a) shows diffraction radiation comprising the −1 diffraction order 850' from the first grating 800. FIG. 9(b) shows diffraction radiation comprising the +1 diffraction order 850" from the first grating 800. FIG. 9(c) shows diffraction radiation comprising the +1 diffraction order 860' of the second grating 810 (and the −1 diffraction order 850' from the first grating 800 which is diffracted at the second grating 810). FIG. 9(d) shows diffraction radiation comprising the −1 diffraction order 860" of the second grating 810 (and the +1 diffraction order 850" from the first grating 800 which is diffracted at the second grating 810). FIG. 9(e) shows diffraction radiation comprising the zeroth diffraction order 870 from the first grating 800 and the second grating 810. It can be seen that in each of these modes contributing to the overlay signal (i.e., the non-zeroth orders) illustrated in FIGS. 8(a) to 8(d), the path lengths are all equal.

The above examples have been discussed mainly in the context of reducing path length differences within the stack when measuring targets comprised in thick stacks. However, there are other reasons why it may be advantageous to measure a target other than one comprising two equal pitch gratings which result in propagating non-zero diffraction orders. Typically, the grating pitch required to obtain propagating non-zero diffraction orders is very different from product feature resolution. This results potentially in very different responses to scanner lens aberrations for the grating and the product features. Also, etch characteristics of large pitch structures can be very different from that of small pitch structures. Additionally, printability of large pitch structures can be severely hampered when using aggressive illuminations (e.g. strong dipole illumination). Below is described a further embodiment which may be used when the distance between first and second gratings is very small. Very small in this context is significantly smaller than the wavelength of the measurement radiation and/or the (smaller) grating pitch of the target).

Figure 10:
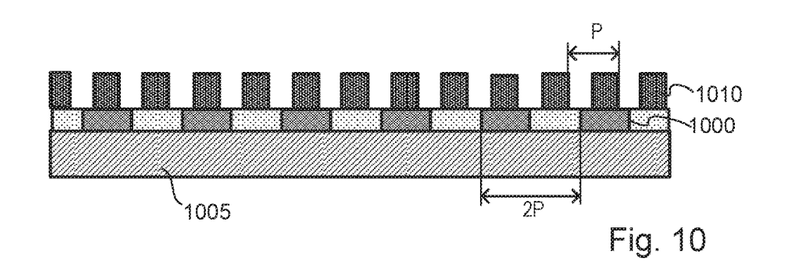
FIG. 10 shows an after-etch target measurable using an overlay measurement method of a first embodiment of the invention.

FIG. 10 shows an after-etch target comprising first (lower) grating 1000 and second (upper) grating 1010 on substrate 1005. The second grating 1010 has been etched all the way down, or very close, to the first grating. As such, in contrast to the examples up to now, there is a very small (or no) distance between first grating 1000 and second grating 1010. As with previous examples, the pitch P of the second grating 1010 is such (relative to the wavelength of the measurement radiation and its angle of incidence on the target) that no propagating diffraction orders are generated at the second grating 1010. As before, such a pitch is simple to determine either mathematically or experimentally; or else a metrology target design platform, such as D4C, can be used.

The pitch of the first grating 1000 should be sufficiently large (again relative to the wavelength of the measurement radiation and angle of incidence onto the target) to generate propagating non-zero diffraction orders. The pitch of first grating 1000 should be an integer multiple of pitch P (e.g., 2P). However, in this example, there is no secondary diffraction at the second grating 1010, as such. Instead, the close proximity of the two gratings 1000, 1010 causes the (e.g., non-zero) diffraction orders of the bottom grating to be disturbed by the top grating, this disturbance depending on the overlay offset (asymmetry) between the gratings 1000, 1010. This disturbance is resultant from evanescent diffraction at the first grating 1010. In this way, overlay signal formation is in the near field only (due to there being no propagative orders at the first grating 1010). Note that because there is no propagating diffraction, the path length differences will be zero. By way of contrast, in the example of FIG. 8, the overlay signal is created in the far field due to the interference of propagating diffraction orders 860', 860", 850', 850" from both gratings.

In this latter embodiment depicted in FIG. 10, it should be noted that the grating with the smaller pitch can be the first (lower) grating or second (upper) grating. Therefore, the grating pitches can be swapped in the arrangement illustrated in FIG. 10; e.g., the first grating may have pitch P and the second grating pitch 2P (or greater). It may be preferred that the thickest layer has the smallest pitch. Furthermore, etching and printability are dependent on pitch and uniformity, such that both are improved the closer the target pitch is to the product resolution and the more uniform the target pattern is. As such, for example, uniform gratings are preferred over "segmented" gratings, where large lines are chopped into smaller lines.

In an embodiment, the angular distribution of the incident measurement radiation is very small. For example, the measurement radiation may comprise laser radiation. Alternatively conventional illumination focused via optics having a very small numerical aperture NA may be used.

Measurement of the overlay signal is performed much as with standard overlay measurements as illustrated in FIG. 7. The concepts disclosed are equally applicable to measurements made in the pupil plane or the image plane (e.g., using either measurement branch of the apparatus of FIG. 3(a). It should be noted that, for the "thick stack" embodiment illustrated in FIG. 8, the measurement radiation is preferably normally incident on the target being measured, whereas typically the measurement radiation is obliquely incident on the target when performing more conventional overlay measurements (and typically may remain obliquely incident for the "after etch" embodiment illustrated in FIG. 10).

In the above disclosure, it has briefly been mentioned that a metrology target design platform, such as D4C, may be used in designing the metrology (overlay) targets. D4C enables a user to be able to perform all required steps to design metrology targets without intervention from the creator of the D4C program. Appropriate graphic user interfaces (GUI) are made available to set up, execute, review and use the features of the D4C program. Usually, no special interface with the fabrication tools is needed, because the metrology target design is mostly confined in the simulation domain rather than in the actual device manufacturing domain.

Conventional target design tools, such as multi-physics 3-D modeling software, usually "draw" or "build" a geometric structure using area or volume elements which are purely graphical. Those graphical elements are assigned multi-physics parametric characteristics. The fundamental difference of the D4C method with the conventional method is that the lithography process itself drives the rendering of the 3D structure of the metrology targets, so the designers do not have to build the model element-by-element.

Figure 11A:
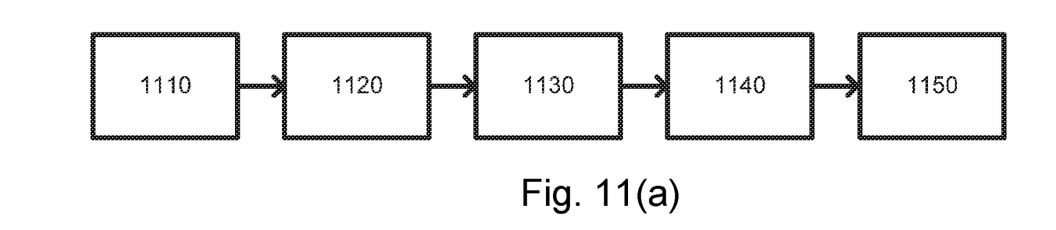
FIGS. 11(a)-(c) comprise flowcharts of different aspects of an exemplary target design method usable in designing targets disclosed herein.

FIG. 11(a) shows a flowchart that lists the main stages of the D4C method. In stage 1110, the materials to be used in the lithography process are selected. The materials may be selected from a materials library interfaced with D4C through an appropriate GUI. In stage 1120, a lithography process is defined by entering each of the process steps, and building a computer simulation model for the entire process sequence. In stage 1130, a metrology target is defined, i.e. dimensions and other characteristics of various features included in the target are entered into the D4C program. For example, if a grating is included in a structure, then the number of grating elements, width of individual grating elements, spacing between two grating elements etc. have to be defined. In stage 1140, the 3D geometry is created. This step also takes into account if there is any information relevant to a multi-layer target design, for example, the relative shifts between different layers. This feature enables multi-layer target design. In stage 1150, the final geometry of the designed target is visualized. As will be explained in greater detail below, not only the final design is visualized, but as the designer applies various steps of the lithography process, he/she can visualize how the 3D geometry is being formed and changed because of process-induced effects. For example, the 3D geometry after resist patterning is different from the 3D geometry after resist removal and etching.

Figure 11B:
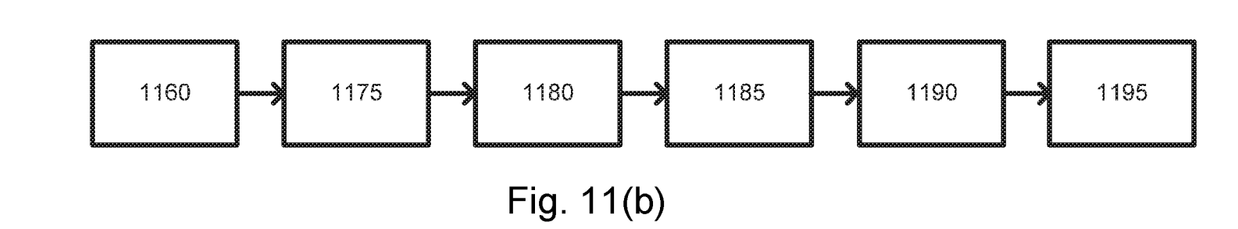

An important aspect of the present disclosure is that the target designer is enabled to visualize the stages of the method to facilitate their perception and control during modeling and simulation. Different visualization tools, referred to as "viewers," are built into the D4C software. For example, as shown in FIG. 11(b), a designer can view material plots 1160 (and may also get a run time estimation plot) depending on the defined lithography process and target. Once the lithography model is created, the designer can view the model parameters through model viewer tool 1175. Design layout viewer tool 1180 may be used to view the design layout (e.g., visual rendering of the GDS file). Resist profile viewer tool 1185 may be used to view pattern profiles in a resist. Geometry viewer tool 1190 may be used to view 3D structures on a wafer. A pupil viewer tool 1195 may be used to view simulated response on a metrology tool. Persons skilled in the art would understand that these viewing tools are available to enhance the understanding of the designer during design and simulation. One or more of these tools may not be present in some embodiments of D4C software, and additional viewing tools may be there in some other embodiments.

D4C enables designers to design thousands or even millions of designs. Not all of these designs will generate a required overlay signal. As already discussed, the "thick stack" embodiment of FIG. 8, requires that there be no propagative diffraction in reflection at the upper grating, but propagative diffraction in transmission at the upper grating of reflected diffraction orders from the lower grating. The "after etch" embodiment illustrated by FIG. 10, requires that there be propagative diffraction in reflection at a first of the gratings (upper or lower), but no propagative diffraction at the second of the gratings; and that the gratings be close enough to each other such that evanescent diffraction orders from the second grating disturbs the diffraction orders from the first grating. To determine one or a subset of such target designs which generate overlay signals, the D4C method allows many designs to be evaluated and visualized. Therefore it is possible to identify which targets generate the required overly signals (and which of these provide the best overlay response, and/or are most robust to process variation etc.).

Figure 11C:
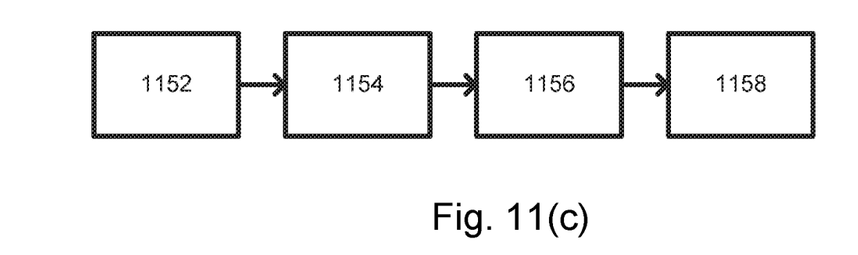

FIG. 11(c) shows a flow chart that illustrates how the D4C process increases efficiency in the overall simulation process by reducing the number of metrology targets selected for the actual simulation of the lithography process. As mentioned before, D4C enables designers to design thousands or even millions of designs. Not all of these designs may be robust against variations in the process steps. To select a subset of target designs that can withstand process variation, a lithographer may intentionally perturb one or more steps of the defined lithography process, as shown in block 1152. The introduction of the perturbation alters the entire process sequence with respect to how it was originally defined. Therefore, applying the perturbed process sequence (block 1154) alters the 3D geometry of the designed target too. A lithographer only selects the perturbations that show non-zero alternations in the original design targets and creates a subset of selected process perturbations (block 1156). The lithography process is then simulated with this subset of process perturbations (block 1158).

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to structural asymmetry.

The program may optionally be arranged to control the optical system, substrate support and the like to perform the steps S2-S5 for measurement of asymmetry on a suitable plurality of targets.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Further embodiments according to the present invention are described in below numbered clauses:

1. A method of measuring a target, said target comprising overlapping periodic structures,
said overlapping periodic structures comprising a first periodic structure and a second periodic structure;
said method comprising illuminating the target with measurement radiation and detecting the resultant scattered radiation;
wherein a pitch of said second periodic structure is such, relative to a wavelength of the measurement radiation and its angle of incidence on the target, that there is no propagative non-zeroth diffraction in reflection at said second periodic structure resultant from said measurement radiation being initially incident on said second periodic structure.
2. A method according to clause 1 wherein the pitch of the first periodic structure is larger than said wavelength of the measurement radiation.
3. A method according to clause 1 or 2 wherein the pitch of the first periodic structure is substantially an integer multiple of that of the second periodic structure.
4. A method according to clause 3 wherein the pitch of the first periodic structure is substantially twice the pitch of the second periodic structure.
5. A method according to any preceding clause wherein the pitch of said second periodic structure is substantially equal to, or smaller than, the wavelength of the measurement radiation.
6. A method according to any preceding clause wherein the only propagative non-zeroth diffraction at said second periodic structure comprises further diffraction, in transmission, of one or more non-zero diffraction orders resultant from diffraction by said first periodic structure.
7. A method according to clause 6 wherein the detected scattered radiation comprises two non-zero diffraction orders from said first periodic structure and said two non-zero diffraction orders from said second periodic structure.
8. A method according to clause 7 wherein said two non-zero diffraction orders from said first periodic structure and said two non-zero diffraction orders from said second periodic structure comprise first diffraction orders.
9. A method according to any of clauses 6 to 8 wherein the second periodic structure has not been etched.
10. A method according to any of clauses 6 to 9 wherein said second periodic structure is the uppermost periodic structure of the overlapping periodic structures.
11. A method according to any of clauses 6 to 10 wherein the measurement radiation is normally incident on said target during the step of illuminating the target.
12. A method according to any of clauses 6 to 11 wherein the pitch of said second periodic structure is sufficiently large for said further diffraction by said second periodic structure to occur.
13. A method according to any of clauses 1 to 5 wherein the second periodic structure has been etched such that the distance between the first periodic structure and the second periodic structure is smaller than the wavelength of the measurement radiation.
14. A method according to clause 13 wherein the detected scattered radiation comprises non-zero diffraction orders obtained from diffraction at said first periodic structure which have been disturbed in the near field by said second periodic structure.
15. A method according to clause 13 or 14 wherein there the detected scattered radiation comprises no propagative diffraction orders resultant from diffraction at said second periodic structure.
16. A method according to any of clauses 13 to 15 wherein said second periodic structure is the thickest of the overlapping periodic structures.
17. A method according to any preceding clause comprising measuring asymmetry in intensities of the detected scattered radiation; and measuring overlay from the measured asymmetry.
18. A substrate comprising an overlay target for measurement of overlay, said overlay target comprising overlapping periodic structures, said overlapping periodic structures comprising a first periodic structure and a second periodic structure; wherein the second periodic structure comprises a pitch smaller than the first periodic structure.
19. A substrate according to clause 18 wherein the pitch of the first periodic structure is an integer multiple of that of the second periodic structure.
20. A substrate according to clause 18 or 19 wherein the pitch of the first periodic structure is twice the pitch of the second periodic structure.
21. A substrate according to clause 18, 19 or 20 wherein the second periodic structure has not been etched and is the uppermost periodic structure of the overlapping periodic structures.

22. A substrate according to clause 18, 19 or 20 wherein the second periodic structure has been etched.

23. An overlay target for measurement of overlay, said overlay target comprising overlapping periodic structures, said overlapping periodic structures comprising a first periodic structure and a second periodic structure; wherein a pitch of said second periodic structure is such, relative to a wavelength of the measurement radiation and its angle of incidence on the target, that there is no propagative non-zeroth diffraction in reflection at said second periodic structure resultant from said measurement radiation being initially incident on said second periodic structure.

24. An overlay target according to clause 23 wherein the pitch of said second periodic structure a pitch of said first periodic structure is such that the only propagative non-zeroth diffraction at said second periodic structure comprises further diffraction, in transmission, of one or more non-zero diffraction orders resultant from diffraction by said first periodic structure.

25. An overlay target according to clause 23 wherein the pitch of said second periodic structure and a pitch of said first periodic structure is such that non-zero diffraction orders obtained from diffraction at said first periodic structure are disturbed in the near field by said second periodic structure to generate an overlay signal.

26. A target design method to design the overlay target of any of clauses 23 to 25.

27. A target design method of clause 26 comprising the steps of:
defining a lithography process;
defining one or more overlay targets of any of clauses 23 to 25, each being varied in terms of one or more parameters;
modelling each of the overlay targets in the context of the lithography process; modelling each overlay target's response during a measurement of the overlay target; and determining whether each overlay target's response generates an overlay signal.

28. A metrology apparatus comprising:
an illumination system configured to illuminate with radiation an overlay target produced using the lithographic process on the substrate;
a detection system configured to detect scattered radiation arising from illumination of the combined target;
wherein said metrology apparatus is operable to perform the method of any of clauses 1 to 17.

29. A lithographic apparatus configured to produce the substrate of any of 18 to 22 by forming said overlay target on said substrate.

30. A lithographic cell comprising the metrology apparatus of clause 28 and/or lithographic apparatus of clause 29.

31. A computer program comprising processor readable instructions which, when run on suitable processor controlled apparatus, cause the processor controlled apparatus to perform the method of any one of clauses 1 to 17.

32. A computer program comprising processor readable instructions which, when run on suitable processor controlled apparatus, cause the processor controlled apparatus to perform the method of any one of clauses 26 or 27.

33. A computer program carrier comprising the computer program of clause 31 or 32.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a target, the target comprising overlapping periodic structures, the overlapping periodic structures comprising a first periodic structure and a second periodic structure, the method comprising:
   illuminating the target with measurement radiation; and
   detecting resultant scattered radiation;
   wherein a pitch of the second periodic structure is such, relative to a wavelength of the measurement radiation and its angle of incidence on the target, that there is no propagative non-zeroth diffraction in reflection at the second periodic structure resultant from the measurement radiation being initially incident on the second periodic structure, and
   wherein an only propagative non-zeroth diffraction at the second periodic structure comprises further diffraction, in transmission, of one or more non-zero diffraction orders resultant from diffraction by the first periodic structure.

2. The method of claim 1, wherein a pitch of the first periodic structure is larger than the wavelength of the measurement radiation.

3. The method of claim 1, wherein the pitch of the second periodic structure is substantially equal to, or smaller than, the wavelength of the measurement radiation.

4. The method of claim 1, wherein the second periodic structure has not been etched.

5. The method of claim 1, wherein the scattered radiation comprises two non-zero diffraction orders from the first periodic structure and two non-zero diffraction orders from the second periodic structure.

6. The method of claim 5, wherein the two non-zero diffraction orders from the first periodic structure and the two non-zero diffraction orders from the second periodic structure comprise first diffraction orders.

7. The method of claim 1, wherein the second periodic structure has been etched such that a distance between the first periodic structure and the second periodic structure is smaller than the wavelength of the measurement radiation.

8. The method of claim 7, wherein the scattered radiation comprises non-zero diffraction orders obtained from diffraction at the first periodic structure that have been disturbed in a near field by the second periodic structure.

9. The method of claim 7, wherein the scattered radiation comprises no propagative diffraction orders resultant from diffraction at the second periodic structure.

10. The method of claim 7, wherein the second periodic structure is the thickest of the overlapping periodic structures.

11. The method of claim 7, further comprising:
measuring asymmetry in intensities of the scattered radiation; and
measuring overlay from the asymmetry.

12. An overlay target for measurement of overlay, the overlay target comprising:
overlapping periodic structures, the overlapping periodic structures comprising a first periodic structure and a second periodic structure;
wherein a pitch of the second periodic structure is such, relative to a wavelength of measurement radiation and its angle of incidence on the target, that there is no propagative non-zeroth diffraction in reflection at the second periodic structure resultant from the measurement radiation being initially incident on the second periodic structure, and
wherein the pitch of the second periodic structure and a pitch of the first periodic structure are such that an only propagative non-zeroth diffraction at the second periodic structure comprises further diffraction, in transmission, of one or more non-zero diffraction orders resultant from diffraction by the first periodic structure.

13. The overlay target of claim 12, wherein the pitch of the second periodic structure and a pitch of the first periodic structure are such that non-zero diffraction orders obtained from diffraction at the first periodic structure are disturbed in the near field by the second periodic structure to generate an overlay signal.

14. A metrology apparatus comprising:
an illumination system configured to illuminate with radiation an overlay target produced using a lithographic process on a substrate;
a detection system configured to detect scattered radiation arising from illumination of the overlay target;
a measuring system configured to measure the overlay target, the overlay target comprising overlapping periodic structures, the overlapping periodic structures comprising a first periodic structure and a second periodic structure,
wherein a pitch of the second periodic structure is such, relative to a wavelength of the radiation and its angle of incidence on the overlay target, that there is no propagative non-zeroth diffraction in reflection at the second periodic structure resultant from the radiation being initially incident on the second periodic structure, and
wherein the pitch of the second periodic structure and a pitch of the first periodic structure are such that the only propagative non-zeroth diffraction at the second periodic structure comprises further diffraction, in transmission, of one or more non-zero diffraction orders resultant from diffraction by the first periodic structure.

15. A data storage medium comprising processor readable instructions which, when run on a suitable processor controlled apparatus, cause the processor controlled apparatus to perform operations comprising:
measuring a target, the target comprising overlapping periodic structures, the overlapping periodic structures comprising a first periodic structure and a second periodic structure;
illuminating the target with measurement radiation; and
detecting resultant scattered radiation;
wherein a pitch of the second periodic structure is such, relative to a wavelength of the measurement radiation and its angle of incidence on the target, that there is no propagative non-zeroth diffraction in reflection at the second periodic structure resultant from the measurement radiation being initially incident on the second periodic structure, and
wherein an only propagative non-zeroth diffraction at the second periodic structure comprises further diffraction, in transmission, of one or more non-zero diffraction orders resultant from diffraction by the first periodic structure.

* * * * *